United States Patent
Kim et al.

(10) Patent No.: US 11,423,969 B2
(45) Date of Patent: Aug. 23, 2022

(54) ELECTRONIC DEVICES PERFORMING TEMPERATURE INFORMATION UPDATE OPERATION

(71) Applicant: SK hynix Inc., Icheon-si (KR)

(72) Inventors: Hyun Seung Kim, Icheon-si (KR); Noh Hyup Kwak, Icheon-si (KR); Jin Suk Oh, Icheon-si (KR); Kyong Ha Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/194,756

(22) Filed: Mar. 8, 2021

(65) Prior Publication Data
US 2022/0130452 A1    Apr. 28, 2022

(30) Foreign Application Priority Data
Oct. 26, 2020   (KR) ........................ 10-2020-0139613

(51) Int. Cl.
| | | |
|---|---|---|
| *G11C 11/406* | (2006.01) | |
| *G11C 11/4093* | (2006.01) | |
| *G11C 11/4076* | (2006.01) | |

(52) U.S. Cl.
CPC .... *G11C 11/40626* (2013.01); *G11C 11/4076* (2013.01); *G11C 11/4093* (2013.01); *G11C 11/40615* (2013.01)

(58) Field of Classification Search
CPC ........ G11C 11/40626; G11C 11/40615; G11C 11/4076; G11C 11/4093
See application file for complete search history.

(56) References Cited

FOREIGN PATENT DOCUMENTS

| CN | 102247073 A | * 11/2011 | ......... G05D 23/1909 |
|---|---|---|---|
| KR | 100401492 B1 | 10/2003 | |
| KR | 1020150062472 A | 6/2015 | |

* cited by examiner

*Primary Examiner* — Sultana Begum
(74) *Attorney, Agent, or Firm* — William Park & Associates Ltd.

(57) ABSTRACT

An electronic device includes a controller and a semiconductor device. The controller outputs a clock signal and a command signal having a first setting combination or a second setting combination and receives a temperature information signal. The semiconductor device compares an input time of a latch signal generated based on the command signal having the first setting combination with an input time of a temperature output control signal generated internally. In addition, the semiconductor device updates a temperature code according a comparison result of the input times of the temperature output control signal and the latch signal to generate the temperature information signal.

22 Claims, 15 Drawing Sheets

ELECTRONIC DEVICES PERFORMING TEMPERATURE INFORMATION UPDATE OPERATION

CROSS-REFERENCE TO RELATED APPLICATIONS

The present application claims priority under 35 U.S.C. 119(a) to Korean Application No. 10-2020-0139613, filed on Oct. 26, 2020, which is incorporated herein by reference in its entirety.

BACKGROUND

1. Technical Field

Embodiments of the present disclosure relate to electronic devices for updating temperature information according to a comparison result of input times of a signal generated from a command signal to update the temperature information and a signal generated internally to update the temperature information.

2. Related Art

Dynamic random access memory (DRAM) devices among semiconductor devices may lose data stored in their memory cells as the time elapses even while their power supplies are applied thereto, in contrast to static random access memory (SRAM) devices or flash memory devices. In order to prevent the data stored in the DRAM cells from being lost, the DRAM devices may be basically accompanied with an operation for rewriting the data from external systems in a certain period, which may be called "a refresh operation". Usually, such a refresh operation may be carried out, in retention times that are inherent in memory cells of the DRAM devices, by activating word lines at least once or more, and sensing/amplifying data of the memory cells. The retention time may be a time for which data can be maintained without a refresh operation after being written into a memory cell. In addition, the retention time may vary according an internal temperature of the DRAM devices. Thus, various methods of adjusting a refresh cycle according to the internal temperature have been proposed.

SUMMARY

According to an embodiment, an electronic device includes a controller and a semiconductor device. The controller may be configured to output a clock signal and a command signal having a first setting combination or a second setting combination and to receive a temperature information signal. The semiconductor device may be configured to compare an input time of a latch signal generated based on the command signal having the first setting combination with an input time of a temperature output control signal generated internally. In addition, the semiconductor device may be configured to update a temperature code according a comparison result of the input times of the temperature output control signal and the latch signal to generate the temperature information signal.

According to another embodiment, an electronic device includes a temperature control circuit and a refresh control circuit. The temperature control circuit may be configured to compare an input time of a temperature output control signal generated internally with an input time of a latch signal generated from a command signal provided by an external device. In addition, the temperature control circuit may be configured to update a temperature code according to a comparison result of the input times of the temperature output control signal and the latch signal to generate a temperature information signal. The refresh control circuit may be configured to generate an internal refresh signal for performing a refresh operation based on a refresh signal generated by the temperature information signal.

According to yet another embodiment, an electronic device includes a temperature control circuit and a refresh control circuit. The temperature control circuit may be configured to compare an input time of a temperature output control signal generated internally with an input time of an internal latch signal. In addition, the temperature control circuit may be configured to update a temperature code according to a comparison result of the input times of the temperature output control signal and the internal latch signal to generate a temperature information signal. The refresh control circuit may be configured to generate an internal refresh signal for performing a refresh operation based on the temperature information signal.

In another embodiment, an electronic device includes a temperature control circuit and a refresh control circuit. The temperature control circuit configured to compare an input time of a temperature output control signal generated internally with an input time of an internal latch signal and configured to update a temperature code according to a comparison result of the input times of the temperature output control signal and the internal latch signal to generate a temperature information signal. The refresh control circuit configured to generate an internal refresh signal for performing a refresh operation based on the temperature information signal, wherein a cycle length of refreshing the temperature information signal is decreased if information in the temperature information signal includes temperature information that indicates a temperature having greater than a predetermined percent increase during a refresh operation and the cycle length is increased if information in the temperature information signal includes temperature information that indicates a temperature having less than a predetermined percent decrease during a refresh operation.

DETAILED DESCRIPTION OF THE EMBODIMENTS

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the present disclosure will be described hereinafter in detail with reference to the accompanying drawings. However, the embodiments described herein are for illustrative purposes only and are not intended to limit the scope of the present disclosure.

Figure 1:
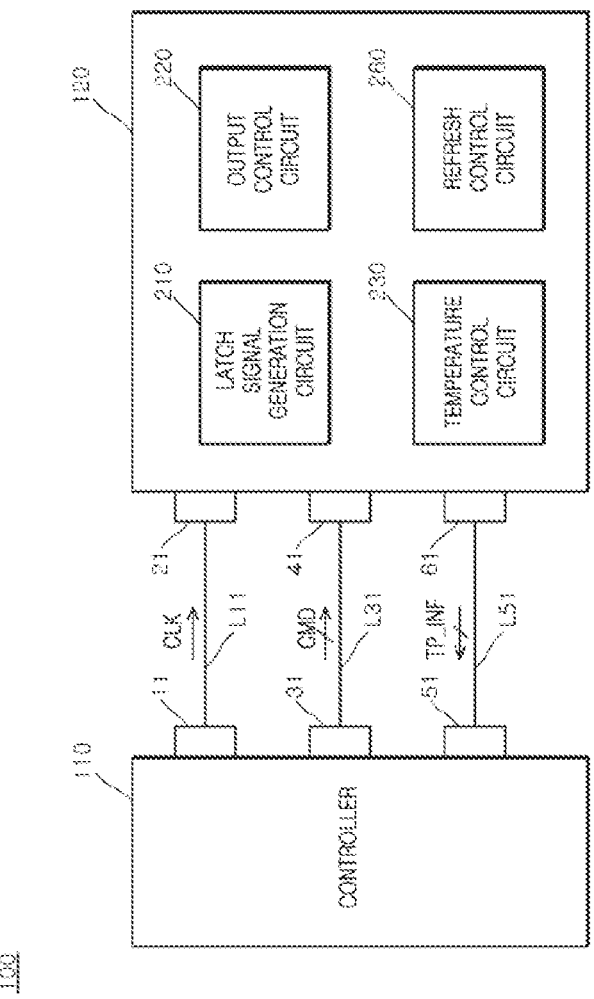
FIG. 1 is a block diagram illustrating a configuration of an electronic device according to an embodiment of the present disclosure.

As illustrated in FIG. 1, an electronic device 100 according to an embodiment of the present disclosure may include a controller 110 and a semiconductor device 120. The semiconductor device 120 may include a latch signal generation circuit 210, an output control circuit 220, a temperature control circuit 230, and a refresh control circuit 260.

The controller 110 may include a first control pin 11, a second control pin 31, and a third control pin 51. The semiconductor device 120 may include a first semiconductor pin 21, a second semiconductor pin 41, and a third semiconductor pin 61. A first transmission line L11 may be connected between the first control pin 11 and the first semiconductor pin 21. A second transmission line L31 may be connected between the second control pin 31 and the second semiconductor pin 41. A third transmission line L51 may be connected between the third control pin 51 and the third semiconductor pin 61. The controller 110 may transmit a clock signal CLK to the semiconductor device 120 through the first transmission line L11 to control the semiconductor device 120. The controller 110 may transmit a command signal CMD to the semiconductor device 120 through the second transmission line L31 to control the semiconductor device 120. The controller 110 may receive a temperature information signal TP_INF from the semiconductor device 120 through the third transmission line L51.

The controller 110 may output the clock signal CLK and the command signal CMD for performing a temperature information update operation to the semiconductor device 120. The controller 110 may receive the temperature information signal TP_INF from the semiconductor device 120. The controller 110 may detect an internal temperature of the semiconductor device 120 based on the temperature information signal TP_INF. The controller 110 may output the clock signal CLK and the command signal CMD for performing a refresh operation to the semiconductor device 120. The controller 110 may adjust an output cycle of the command signal CMD for performing an auto-refresh operation based on the temperature information signal TP_INF. The command signal CMD may be continuously outputted in synchronization with odd pulses or even pulses included in the clock signal CLK. Although the command signal CMD may be illustrated as a single signal, the command signal CMD may be set to include a plurality of bits. Similarly, although the temperature information signal TP_INF may be illustrated as a single signal, the temperature information signal TP_INF may be set to include a plurality of bits.

The latch signal generation circuit 210 may be synchronized with the clock signal CLK to generate a latch signal (MLAT in FIG. 2) based on the command signal CMD. The latch signal generation circuit 210 may generate the latch signal (MLAT in FIG. 2) which may be enabled when the command signal CMD inputted in synchronization with the clock signal CLK has a logic level combination of a first setting combination.

The output control circuit 220 may be synchronized with in internal clock signal (ICLK of FIG. 2) to generate a temperature output control signal (TCO in FIG. 2) which may be periodically enabled. The output control circuit 220 may generate the temperature output control signal (TCO in FIG. 2) including a pulse which may be generated when a pulse of the internal clock signal (ICLK in FIG. 2) is inputted by a set number of times.

Figure 2:
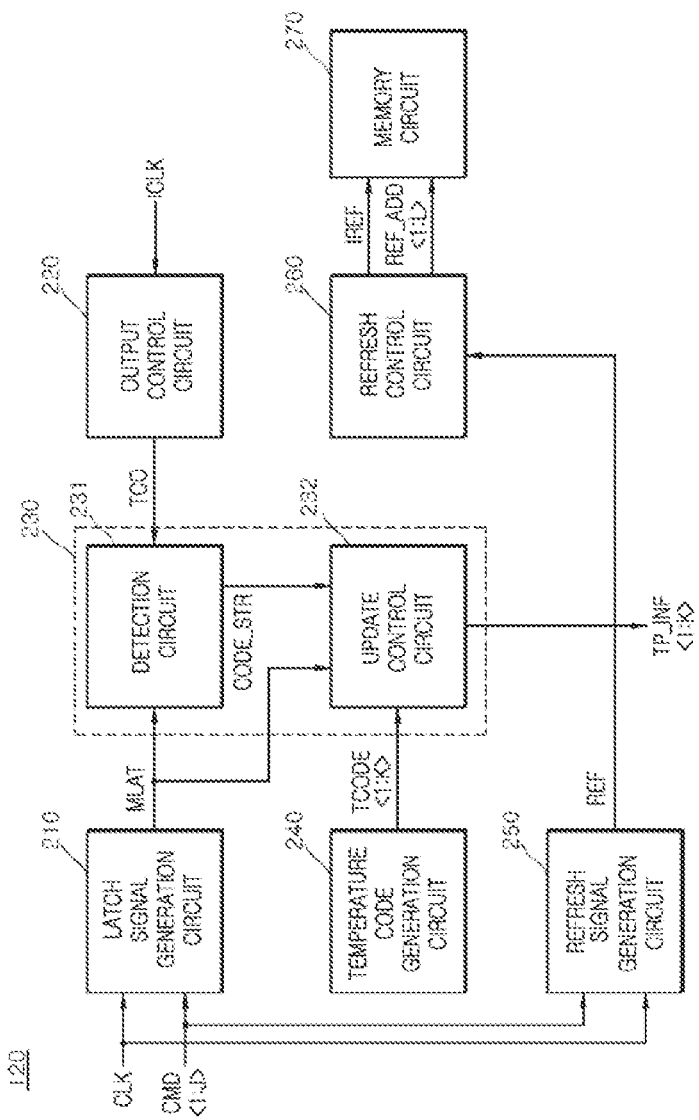
FIG. 2 is a block diagram illustrating a configuration of a semiconductor device included in the electronic device illustrated in FIG. 1.

The temperature control circuit 230 may compare an input time of the temperature output control signal (TCO in FIG. 2) with an input time of the latch signal (MLAT in FIG. 2). The temperature control circuit 230 may update a temperature code (e.g., first to $K^{th}$ temperature codes TCODE<1:K> in FIG. 2) according to a comparison result of the input times of the temperature output control signal (TCO in FIG. 2) and the latch signal (MLAT in FIG. 2). The temperature control circuit 230 may interrupt the update of the temperature code (TCODE<1:K> in FIG. 2) according to the comparison result of the input times of the temperature output control signal (TCO in FIG. 2) and the latch signal (MLAT in FIG. 2). The temperature control circuit 230 may generate the temperature information signal TP_INF based on the updated temperature code (TCODE<1:K> in FIG. 2).

The refresh control circuit 260 may adjust a cycle of the refresh operation (i.e., a refresh operation cycle). The refresh control circuit 260 may reduce the refresh operation cycle when the temperature information signal TP_INF includes high temperature information during a self-refresh operation. The refresh control circuit 260 may increase the refresh operation cycle when the temperature information signal TP_INF includes low temperature information during the self-refresh operation. The refresh operation may indicate an operation including the auto-refresh operation and the self-refresh operation.

FIG. 2 is a block diagram illustrating a configuration of the semiconductor device 120. As illustrated in FIG. 2, the semiconductor device 120 may include the latch signal generation circuit 210, the output control circuit 220, the temperature control circuit 230, a temperature code generation circuit 240, a refresh signal generation circuit 250, the refresh control circuit 260, and a memory circuit 270.

The latch signal generation circuit 210 may be synchronized with the clock signal CLK to generate the latch signal MLAT based on the command signal (e.g., first to $J^{th}$ command signals CMD<1:J>). The latch signal generation circuit 210 may generate the latch signal MLAT that may be enabled when the first to $J^{th}$ command signals CMD<1:J> inputted in synchronization with the clock signal CLK have a logic level combination of the first setting combination. The latch signal generation circuit 210 may generate the latch signal MLAT including a pulse which may be generated when the first to $J^{th}$ command signals CMD<1:J> inputted in synchronization with the clock signal CLK have a logic level combination of the first setting combination. The first setting combination may be set to be different according to the embodiments. The latch signal MLAT may be set as a signal that may be enabled when the first to $J^{th}$ command signals CMD<1:J> for a mode register read operation are inputted.

The output control circuit 220 may be synchronized with the internal clock signal ICLK to generate the temperature output control signal TCO that may be periodically enabled. The output control circuit 220 may generate the temperature output control signal TCO by counting pulses of the internal clock signal ICLK. The output control circuit 220 may generate the temperature output control signal TCO including a pulse generated when a pulse of the internal clock signal ICLK is inputted by a set number of times. The internal clock signal ICLK may be set as a signal generated in the semiconductor device 120 based on the clock signal CLK outputted from the controller 110. The set number of times means a predetermined number of times by which a pulse included in the internal clock signal ICLK may be inputted to the output control circuit 220, and the set number of times may be set to be different according to embodiments. The temperature output control signal TCO may be set as a signal that is enabled to update the first to $K^{th}$ temperature codes TCODE<1:K> at a time when the first to $K^{th}$ temperature codes TCODE<1:K> change.

The temperature control circuit 230 may include a detection circuit 231 and an update control circuit 232.

The detection circuit 231 may compare an input time of the temperature output control signal TCO with an input time of the latch signal MLAT. The detection circuit 231 may generate a code strobe signal CODE_STR whose pulse width is adjusted according to a comparison result of the input times of the temperature output control signal TCO and the latch signal MLAT. The detection circuit 231 may compare an input time of the temperature output control signal TCO with an input time of the latch signal MLAT.

The update control circuit 232 may update the first to $K^{th}$ temperature codes TCODE<1:K> based on the latch signal MLAT and the code strobe signal CODE_STR. The update control circuit 232 may interrupt the update of the first to $K^{th}$ temperature codes TCODE<1:K> based on the latch signal MLAT and the code strobe signal CODE_STR. The update control circuit 232 may generate the temperature information signal TP_INF (e.g., first to $K^{th}$ temperature information signals TP_INF<1:K>) based on the first to $K^{th}$ temperature codes TCODE<1:K> updated by the latch signal MLAT and the code strobe signal CODE_STR.

The temperature control circuit 230 may compare an input time of the temperature output control signal TCO with an input time of the latch signal MLAT. The temperature control circuit 230 may update the first to $K^{th}$ temperature codes TCODE<1:K> according to a comparison result of the input times of the temperature output control signal TCO and the latch signal MLAT. The temperature control circuit 230 may interrupt the update of the first to $K^{th}$ temperature codes TCODE<1:K> according to the comparison result of the input times of the temperature output control signal TCO and the latch signal MLAT. The temperature control circuit 230 may generate the first to $K^{th}$ temperature information signals TP_INF<1:K> based on the first to $K^{th}$ temperature codes TCODE<1:K> which are updated. The first to $K^{th}$ temperature information signals TP_INF<1:K> may be outputted to the controller 110.

The temperature code generation circuit 240 may generate the first to $K^{th}$ temperature codes TCODE<1:K> according to an internal temperature of the semiconductor device 120. The temperature code generation circuit 240 may periodically generate the first to $K^{th}$ temperature codes TCODE<1:K> including temperature information of the semiconductor device 120. The first to $K^{th}$ temperature codes TCODE<1:K> may be periodically generated regardless of external control. A cycle that the first to $K^{th}$ temperature codes TCODE<1:K> are generated may be set to be different according to embodiments.

Meanwhile, a logic level combination of the first to $K^{th}$ temperature codes TCODE<1:K> generated by the temperature code generation circuit 240 may be changed or may not be changed according to the internal temperature of the semiconductor device 120 at a time when the temperature output control signal TCO is generated.

The refresh signal generation circuit 250 may be synchronized with the clock signal CLK to generate a refresh signal REF based on the first to $J^{th}$ command signals CMD<1:J>. The refresh signal generation circuit 250 may generate the refresh signal REF that is enabled when the first to $J^{th}$ command signals CMD<1:J> inputted in synchronization with the clock signal CLK have a logic level combination of a second setting combination. The refresh signal generation circuit 250 may generate the refresh signal REF including a pulse generated when the first to $J^{th}$ command signals CMD<1:J> inputted in synchronization with the clock signal CLK have a logic level combination of the second setting combination. The second setting combination may be set to have different logic level combinations according to embodiments. The first setting combination and the second setting combination may have different logic level combinations. The refresh signal REF may be set as a signal that is enabled during the auto-refresh operation.

The refresh control circuit 260 may generate an internal refresh signal IREF and first to $L^{th}$ refresh addresses REF_ADD<1:L> based on the refresh signal REF. The refresh control circuit 260 may generate the internal refresh signal IREF and the first to $L^{th}$ refresh addresses REF_ADD<1:L> whenever the refresh signal REF is inputted to the refresh control circuit 260.

The memory circuit 270 may perform a refresh operation based on the internal refresh signal IREF and the first to $L^{th}$ refresh addresses REF_ADD<1:L>. The memory circuit 270 may perform the refresh operation for memory cells (not illustrated) selected by the first to $L^{th}$ refresh addresses REF_ADD<1:L> whenever a pulse of the internal refresh signal IREF is inputted. The refresh operation may include the auto-refresh operation and the self-refresh operation. Although the memory circuit 270 as illustrated has a configuration for performing the refresh operation, the memory circuit 270 may also be configured to additionally perform a read operation and a write operation for the output and input of data.

Figure 3:
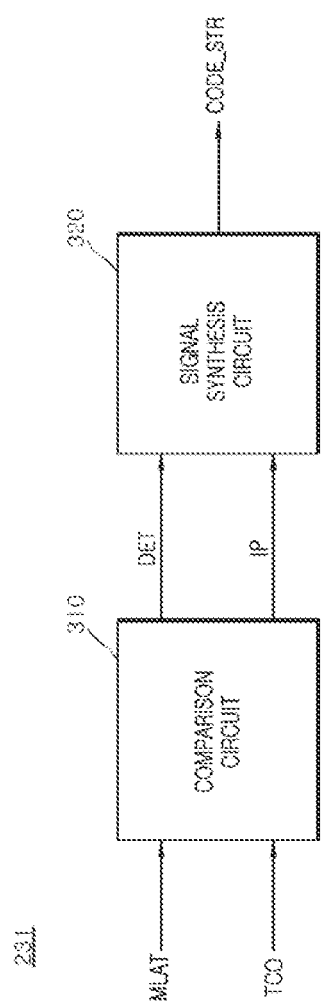
FIG. 3 is a block diagram illustrating a configuration of a detection circuit included in the semiconductor device illustrated in FIG. 2.

As illustrated in FIG. 3, the detection circuit 231 may include a comparison circuit 310 and a signal synthesis circuit 320.

The comparison circuit 310 may compare an input time of the temperature output control signal TCO with an input time of the latch signal MLAT. The comparison circuit 310 may generate a detection signal DET according to a comparison result of the input times of the temperature output control signal TCO and the latch signal MLAT. The comparison circuit 310 may be synchronized with a falling edge of the temperature output control signal TCO to generate an internal pulse signal IP that is enabled. An operation of the comparison circuit 310 for generating the detection signal DET and the internal pulse signal IP will be described in detail with reference to FIG. 4 later.

The signal synthesis circuit 320 may synthesize the detection signal DET and the internal pulse signal IP to generate the code strobe signal CODE_STR. The signal synthesis circuit 320 may generate the code strobe signal CODE_STR whose pulse width is adjusted by synthesizing the detection signal DET and a pulse of the internal pulse signal IP. An operation of the signal synthesis circuit 320 for generating the code strobe signal CODE_STR whose pulse width may be adjusted will be described in detail with reference to FIG. 5 later.

Figure 4:
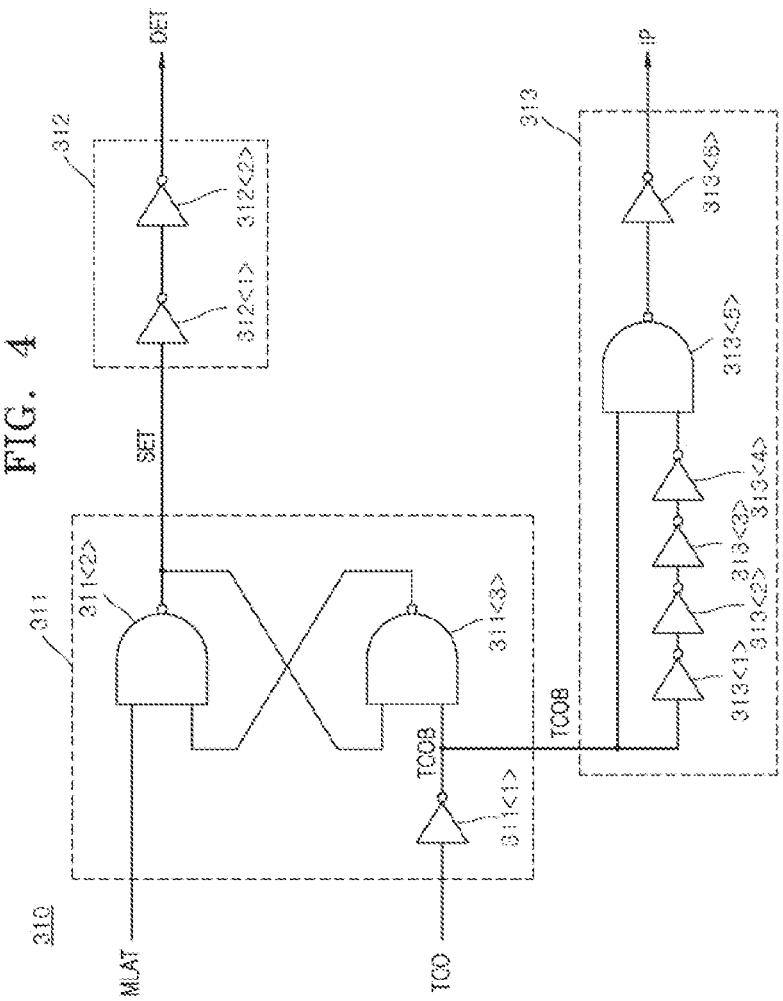
FIG. 4 is a circuit diagram illustrating a configuration of a comparison circuit included in the detection circuit illustrated in FIG. 3.

As illustrated in FIG. 4, the comparison circuit 310 may include a setting signal generation circuit 311, a buffer circuit 312, and a pulse generation circuit 313.

The setting signal generation circuit 311 may be realized using an inverter 311<1> and NAND gates 311<2> and 311<3>. The inverter 311<1> may inversely buffer the temperature output control signal TCO to generate an inverted temperature output control signal TCOB. The NAND gate 311<2> may generate a setting signal SET that is enabled to have a logic "high" level at a time when the latch signal MLAT having a logic "low" level is inputted to the NAND gate 311<2>. The NAND gate 311<2> may generate the setting signal SET that is disabled to have a logic "low" level when the latch signal MLAT has a logic "high" level and an output signal of the NAND gate 311<3> has a logic "high" level. The NAND gate 311<3> may generate an output signal of a logic "high" level at a time when the inverted temperature output control signal TCOB having a logic "low" level is inputted to the NAND gate 311<3>.

The setting signal generation circuit 311 may be synchronized with a falling edge of the latch signal MLAT to generate the setting signal SET that is enabled. The setting signal generation circuit 311 may be synchronized with a rising edge of the temperature output control signal TCO to generate the setting signal SET that is disabled.

The buffer circuit 312 may be realized using inverters 312<1> and 312<2>. The inverter 312<1> may generate an output signal of a logic "low" level by removing a glitch that is included in the setting signal SET of a logic "high" level. The inverter 312<2> may generate the detection signal DET of a logic "high" level by removing a glitch that is included in an output signal of the inverter 312<1> having a logic "low" level. In some other embodiments, the inverter 312<1> may generate the output signal of a logic "high" level by removing a glitch that is included in the setting signal SET of a logic "low" level, and the inverter 312<2> may generate the detection signal DET of a logic "low" level by removing a glitch that is included in the output signal of the inverter 312<1> having a logic "high" level.

The buffer circuit 312 may remove a glitch that is included in the setting signal SET. The buffer circuit 312 may buffer the setting signal SET to generate the detection signal DET from which the glitch is removed.

The pulse generation circuit 313 may be realized using inverters 313<1>, 313<2>, 313<3>, 313<4>, and 313<6> and a NAND gate 313<5>. The pulse generation circuit 313 may generate the internal pulse signal IP including a pulse generated by the inverted temperature output control signal TCOB obtained by inverting the temperature output control signal TCO. The pulse generation circuit 313 may generate the internal pulse signal IP having a logic "low" level at a time when the inverted temperature output control signal TCOB having a logic "low" level is inputted. The pulse generation circuit 313 may generate the internal pulse signal IP having a logic "high" level after a delay time determined by the inverters 313<1>, 313<2>, 313<3>, and 313<4> elapses from a time when the inverted temperature output control signal TCOB having a logic "high" level is inputted after the inverted temperature output control signal TCOB having a logic "low" level is inputted. As a result, the pulse generation circuit 313 may generate the internal pulse signal IP including a pulse having a logic "low" level during a period corresponding to a sum of a retention time that the inverted temperature output control signal TCOB maintains a logic "low" level and a delay time determined by the inverters 313<1>, 313<2>, 313<3>, and 313<4> in the event that a level of the inverted temperature output control signal TCOB changes from a logic "low" level into a logic "high" level.

Figure 5:
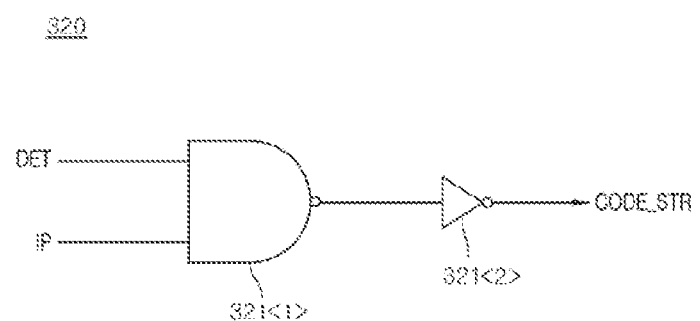
FIG. 5 is a circuit diagram illustrating a configuration of a signal synthesis circuit included in the detection circuit illustrated in FIG. 3.

As illustrated in FIG. 5, the signal synthesis circuit 320 may be realized using a NAND gate 321<1> and an inverter 321<2>.

The NAND gate 321<1> may perform a logical NAND operation for the detection signal DET and the internal pulse signal IP to output a result of the logical NAND operation. The inverter 321<2> may inversely buffer an output signal of the NAND gate 321<1> to generate the code strobe signal CODE_STR.

The signal synthesis circuit 320 may perform a logical AND operation for the detection signal DET and the internal pulse signal IP to generate the code strobe signal CODE_STR. The signal synthesis circuit 320 may generate the code strobe signal CODE_STR that is enabled to have a logic "low" level when one of the detection signal DET and the internal pulse signal IP has a logic "low" level. The signal synthesis circuit 320 may generate the code strobe signal CODE_STR that is disabled to have a logic "high" level when both of the detection signal DET and the internal pulse signal IP have a logic "high" level.

Figure 6:
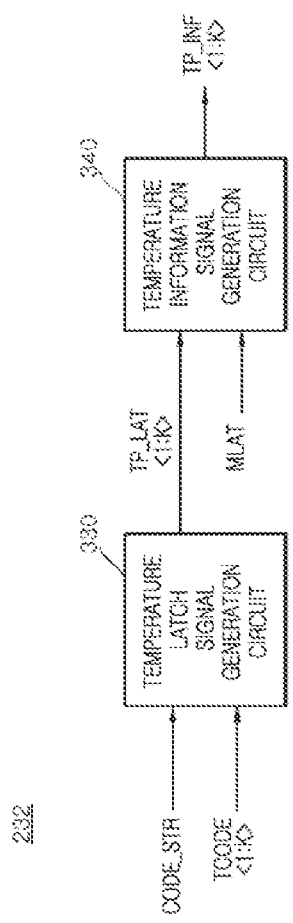
FIG. 6 is a block diagram illustrating a configuration of an update control circuit included in the semiconductor device illustrated in FIG. 2.

As illustrated in FIG. 6, the update control circuit 232 may include a temperature latch signal generation circuit 330 and a temperature information signal generation circuit 340.

The temperature latch signal generation circuit 330 may generate first to $K^{th}$ temperature latch signals TP_LAT<1:K> based on the first to $K^{th}$ temperature codes TCODE<1:K> and the code strobe signal CODE_STR. The temperature latch signal generation circuit 330 may update the first to $K^{th}$ temperature codes TCODE<1:K> based on the code strobe signal CODE_STR. The temperature latch signal generation circuit 330 may generate the first to $K^{th}$ temperature latch signals TP_LAT<1:K> by interrupting the update of the first to $K^{th}$ temperature codes TCODE<1:K> based on the code strobe signal CODE_STR. An operation of the temperature latch signal generation circuit 330 for generating the first to $K^{th}$ temperature latch signals TP_LAT<1:K> will be described with reference to FIG. 7 later.

The temperature information signal generation circuit 340 may generate the first to $K^{th}$ temperature information signals TP_INF<1:K> based on the first to $K^{th}$ temperature latch signals TP_LAT<1:K> and the latch signal MLAT. The temperature information signal generation circuit 340 may be synchronized with a rising edge of the latch signal MLAT to generate the first to $K^{th}$ temperature information signals TP_INF<1:K> based on the first to $K^{th}$ temperature latch signals TP_LAT<1:K>. An operation of the temperature information signal generation circuit 340 for generating the first to $K^{th}$ temperature information signals TP_INF<1:K> will be described with reference to FIG. 8 later.

Figure 7:
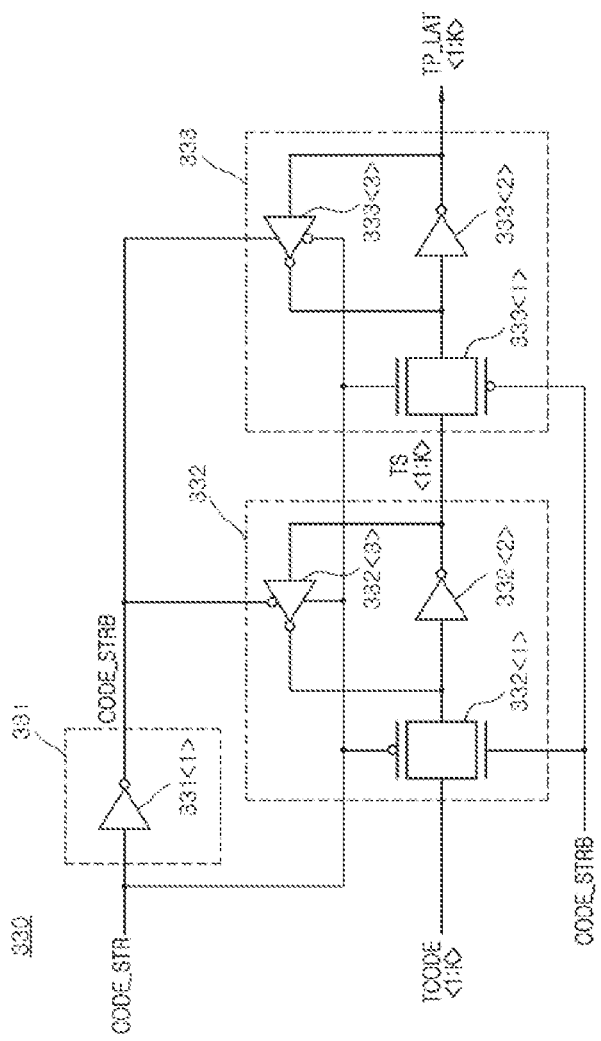
FIG. 7 is a circuit diagram illustrating a configuration of a temperature latch signal generation circuit included in the update control circuit illustrated in FIG. 6.

As illustrated in FIG. 7, the temperature latch signal generation circuit 330 may include an inverted code strobe signal generation circuit 331, a first input circuit 332 and a second input circuit 333.

The inverted code strobe signal generation circuit 331 may be realized using an inverter 331<1>. The inverted code strobe signal generation circuit 331 may inversely buffer the code strobe signal CODE_STR to generate an inverted code strobe signal CODE_STRB.

The first input circuit 332 may be realized using a transfer gate 332<1> and inverters 332<2> and 332<3>. The transfer gate 332<1> may be turned on by the code strobe signal CODE_STR which has a logic "low" level and the inverted code strobe signal CODE_STRB which has a logic "high" level to receive and output the first to $K^{th}$ temperature codes TCODE<1:K>. The inverter 332<2> may inversely buffer the first to $K^{th}$ temperature codes TCODE<1:K> to generate first to $K^{th}$ transmission signals TS<1:K>. The inverters 332<2> and 332<3> may latch the first to $K^{th}$ transmission signals TS<1:K> based on the code strobe signal CODE_STR of a logic "high" level and the inverted code strobe signal CODE_STRB of a logic "low" level. When the code strobe signal CODE_STR is enabled to have a logic "low" level, the first input circuit 332 may update the first to $K^{th}$ temperature codes TCODE<1:K> to generate the first to $K^{th}$ transmission signals TS<1:K>). When the code strobe signal CODE_STR is disabled to have a logic "high" level, the first input circuit 332 may interrupt the update of the first to $K^{th}$ temperature codes TCODE<1:K>.

The second input circuit 333 may be realized using a transfer gate 333<1> and inverters 333<2> and 333<3>. The transfer gate 333<1> may be turned on by the code strobe signal CODE_STR which has a logic "high" level and the inverted code strobe signal CODE_STRB which has a logic "low" level to receive and output the first to $K^{th}$ transmission signals TS<1:K>. The inverter 333<2> may inversely buffer the first to $K^{th}$ transmission signals TS<1:K> to generate the first to $K^{th}$ temperature latch signals TP_LAT<1:K>. The inverters 333<2> and 333<3> may latch the first to $K^{th}$ temperature latch signals TP_LAT<1:K> based on the code strobe signal CODE_STR which has a logic "low" level and the inverted code strobe signal CODE_STRB which has a logic "high" level. When the code strobe signal CODE_STR is disabled to have a logic "high" level, the second input circuit 333 may inversely buffer the first to $K^{th}$ transmission signals TS<1:K> to generate the first to $K^{th}$ temperature latch signals TP_LAT<1:K>.

Although the temperature latch signal generation circuit 330 including the inverted code strobe signal generation circuit 331, the first input circuit 332, and the second input circuit 333 illustrated in FIG. 7 is illustrated as a single circuit, the temperature latch signal generation circuit 330 may be configured to include "K"-number of circuits, the number of which is equal to the number of bits included in the first to $K^{th}$ temperature latch signals TP_LAT<1:K>.

Figure 8:
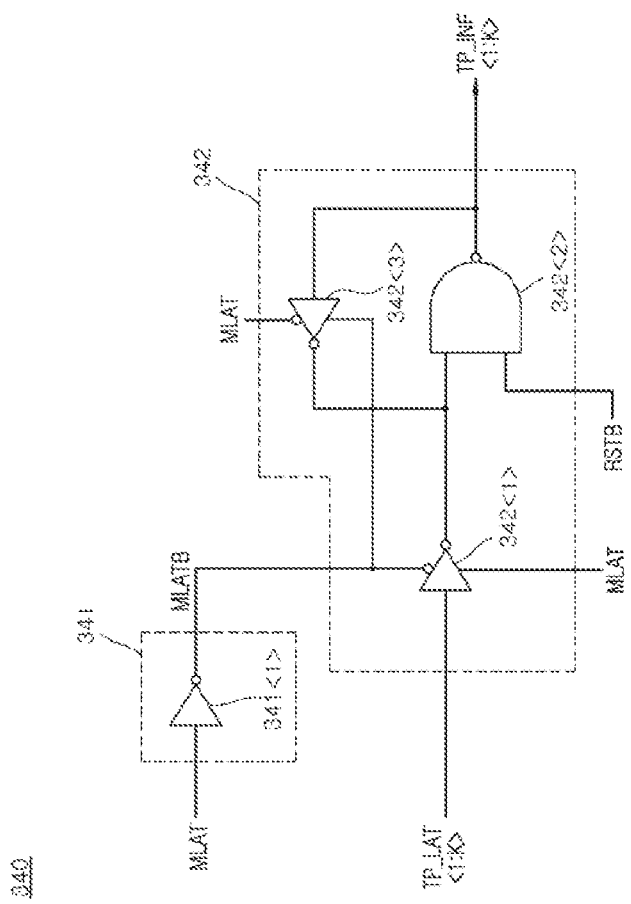
FIG. 8 is a circuit diagram illustrating a configuration of a temperature information signal generation circuit included in the update control circuit illustrated in FIG. 6.

As illustrated in FIG. 8, the temperature information signal generation circuit 340 may include an inverted latch signal generation circuit 341 and an output circuit 342.

The inverted latch signal generation circuit 341 may be realized using an inverter 341<1>. The inverted latch signal generation circuit 341 may inversely buffer the latch signal MLAT to generate an inverted latch signal MLATB.

The output circuit 342 may be realized using an inverter 342<1>, a NAND gate 342<2>, and an inverter 342<3>.

The inverter 342<1> may be turned on by the latch signal MLAT which has a logic "high" level and the inverted latch signal MLATB which has a logic "low" level to inversely buffer the first to $K^{th}$ temperature latch signals TP_LAT<1:K> and to output the inversely buffered signals of the first to $K^{th}$ temperature latch signals TP_LAT<1:K>.

The NAND gate 342<2> may generate the first to $K^{th}$ temperature information signals TP_INF<1:K> that are initialized by a reset signal RSTB. The NAND gate 342<2> may generate the first to $K^{th}$ temperature information signals TP_INF<1:K>, all of bits of which are initialized to have a logic "high" level when the reset signal RSTB is enabled to have a logic "low" level. When the reset signal RSTB is disabled to have a logic "high" level, the NAND gate 342<2> may inversely buffer an output signal of the inverter 342<1> to generate the first to $K^{th}$ temperature information signals TP_INF<1:K>. The reset signal RSTB may be enabled to have a logic "low" level during a predetermined period to perform an initialization operation when various operation of the semiconductor device 120 starts.

The inverter 342<3> and the NAND gate 342<2> may latch the first to $K^{th}$ temperature information signals TP_INF<1:K> based on the latch signal MLAT which has a logic "low" level and the inverted latch signal MLATB which has a logic "high" level.

Although the temperature information signal generation circuit 340 which includes the inverted latch signal generation circuit 341 and the output circuit 342 illustrated in FIG. 8 is illustrated as a single circuit, the temperature information signal generation circuit 340 may be configured to include "K"-number of circuits, the number of which is equal to the number of bits included in the first to $K^{th}$ temperature information signals TP_INF<1:K>.

The temperature information update operation and the refresh operation of the electronic device 100 illustrated in FIGS. 1 to 8 will be described hereinafter with reference to FIG. 9 in conjunction with a case that the latch signal MLAT generated from the command signal CMD may be inputted to the temperature control circuit 230 earlier than the temperature output control signal TCO generated internally.

Figure 9:
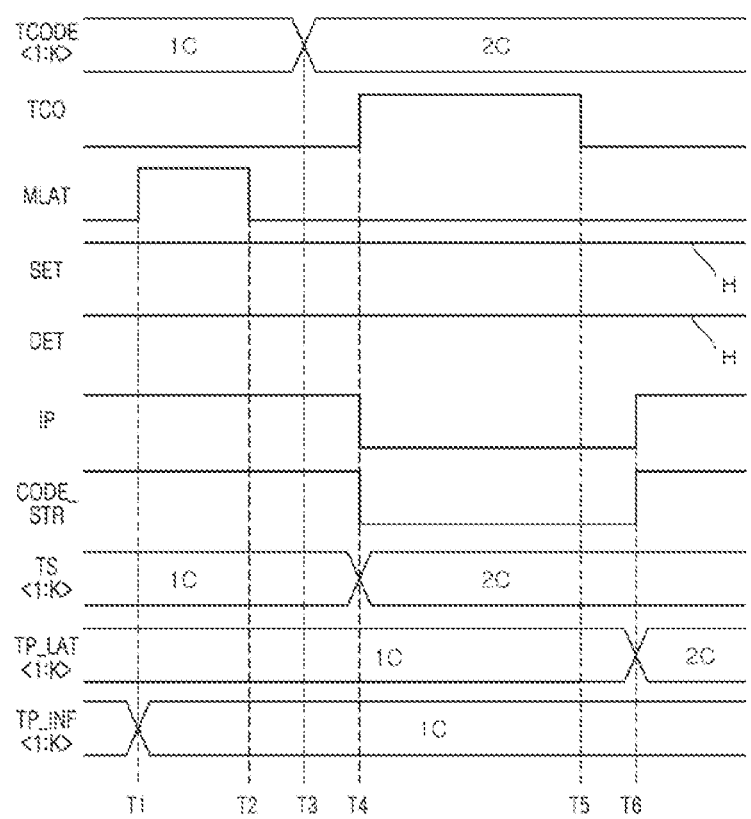
FIGS. 9 to 13 are timing diagrams illustrating an operation of the electronic device according to an embodiment of the present disclosure.

First, it may be assumed that "1C" illustrated in FIG. 9 may be set as a first logic level combination, "2C" illustrated in FIG. 9 may be set as a second logic level combination, and the first logic level combination may be different from the second logic level combination.

At a time "T1", the latch signal generation circuit 210 may generate the latch signal MLAT that is enabled to have a logic "high" level based on the first to $J^{th}$ command signals CMD<1:J> having a first setting combination inputted in synchronization with the clock signal CLK. A pulse width of the latch signal MLAT may be set as a period from the time "T1" to a time "T2".

The temperature information signal generation circuit 340 may generate the first to $K^{th}$ temperature information signals TP_INF<1:K> having a first logic level combination based on the first to $K^{th}$ temperature latch signals TP_LAT<1:K> generated by the latch signal MLAT having a logic "high" level. The first to $K^{th}$ temperature information signals TP_INF<1:K> may be outputted to the controller 110.

At a time "T3", the temperature code generation circuit 240 may generate the first to $K^{th}$ temperature codes TCODE<1:K> having a second logic level combination according to an internal temperature of the semiconductor device 120.

At a time "T4", the output control circuit 220 may be synchronized with the internal clock signal ICLK to generate the temperature output control signal TCO that is enabled to have a logic "high" level. A pulse width of the temperature output control signal TCO may be set as a period from the time "T4" to a time "T5".

The pulse generation circuit 313 may generate the internal pulse signal IP of a logic "low" level based on the inverted temperature output control signal TCOB of a logic "low" level obtained by inverting the temperature output control signal TCO.

The signal synthesis circuit 320 may generate the code strobe signal CODE_STR of a logic "low" level by performing a logical AND operation for the detection signal DET which has a logic "high" level and the internal pulse signal IP which has a logic "low" level.

The first input circuit 332 may update the first to $K^{th}$ temperature codes TCODE<1:K> of the second logic level combination based on the code strobe signal CODE_STR which has a logic "low" level to generate the first to $K^{th}$ transmission signals TS<1:K>.

At a time "T6", the pulse generation circuit 313 may generate the internal pulse signal IP which has a logic "high" level.

The signal synthesis circuit 320 may generate the code strobe signal CODE_STR which has a logic "high" level by performing a logical AND operation for the detection signal DET which has a logic "high" level and the internal pulse signal IP which has a logic "high" level.

The second input circuit 333 may inversely buffer the first to $K^{th}$ transmission signals TS<1:K> based on the code strobe signal CODE_STR which has a logic "high" level to generate the first to $K^{th}$ temperature latch signals TP_LAT<1:K> of the second logic level combination.

The controller 110 may adjust the refresh operation cycle based on the first to $K^{th}$ temperature information signals TP_INF<1:K> of the first logic level combination which are updated at the time "T1".

The electronic device 100 may update the first to $K^{th}$ temperature codes TCODE<1:K> having the first logic level combination based on the latch signal MLAT generated from the command signal CMD during the temperature information update operation. The electronic device 100 may adjust the refresh operation cycle based on the first to $K^{th}$ temperature information signals TP_INF<1:K> of the first logic level combination which are generated from the updated first to $K^{th}$ temperature codes TCODE<1:K>.

The temperature information update operation and the refresh operation of the electronic device 100 will be described hereinafter with reference to FIG. 10 in conjunction with a case that the latch signal MLAT generated from the command signal CMD may be inputted to the temperature control circuit 230 earlier than the temperature output control signal TCO generated internally and pulses of the latch signal MLAT and the temperature output control signal TCO at least partially overlap with each other.

Figure 10:
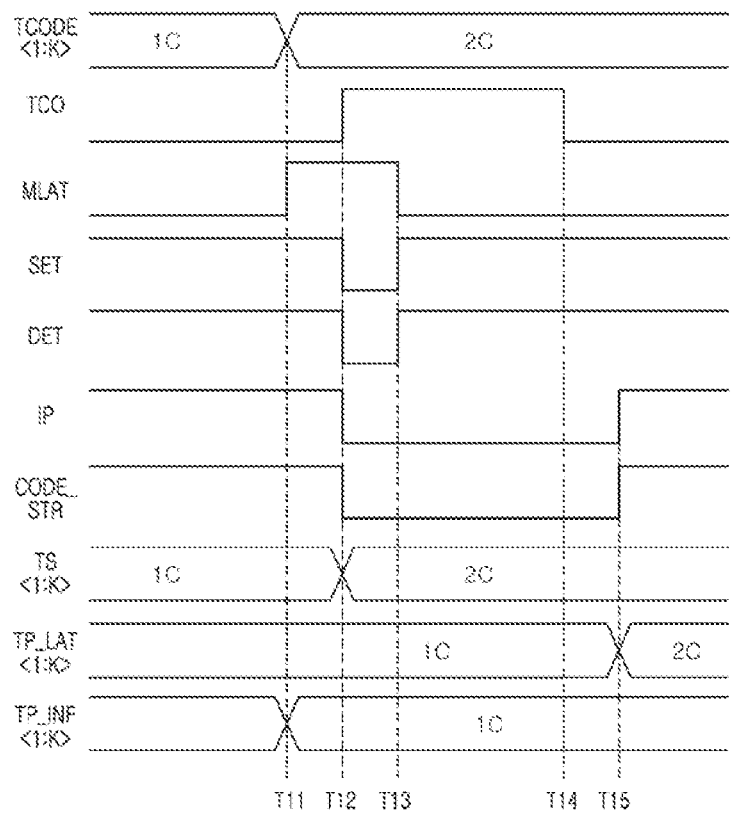

First, it may be assumed that "1C" illustrated in FIG. 10 may be set as a first logic level combination, "2C" illustrated in FIG. may be set as a second logic level combination, and the first logic level combination may be different from the second logic level combination.

At a time "T11", the temperature code generation circuit 240 may generate the first to $K^{th}$ temperature codes TCODE<1:K> of the second logic level combination according to an internal temperature of the semiconductor device 120.

The latch signal generation circuit 210 may generate the latch signal MLAT that is enabled to a logic "high" level by the first to $J^{th}$ command signals CMD<1:J> of a first setting combination which are inputted in synchronization with the clock signal CLK. A pulse width of the latch signal MLAT may be set as a period from the time "T11" to a time "T13".

The temperature information signal generation circuit 340 may generate the first to $K^{th}$ temperature information signals TP_INF<1:K> having a first logic level combination based on the first to $K^{th}$ temperature latch signals TP_LAT<1:K> generated by the latch signal MLAT which has a logic "high" level. The first to $K^{th}$ temperature information signals TP_INF<1:K> may be outputted to the controller 110.

At a time "T12", the output control circuit 220 may be synchronized with the internal clock signal ICLK to generate the temperature output control signal TCO that is enabled to have a logic "high" level. A pulse width of the temperature output control signal TCO may be set as a period from the time "T12" to a time "T14".

The setting signal generation circuit 311 may be synchronized with a rising edge of the latch signal MLAT to generate the setting signal SET having a logic "low" level.

The buffer circuit 312 may remove a glitch that is included in the setting signal SET and may buffer the setting signal SET without the glitch to generate the detection signal DET having a logic "low" level.

The signal synthesis circuit 320 may generate the code strobe signal CODE_STR having a logic "low" level by performing a logical AND operation for the detection signal DET which has a logic "low" level and the internal pulse signal IP which has a logic "low" level.

The first input circuit 332 may update the first to $K^{th}$ temperature codes TCODE<1:K> having the second logic level combination based on the code strobe signal CODE_STR which has a logic "low" level to generate the first to $K^{th}$ transmission signals TS<1:K>.

At the time "T13", the setting signal generation circuit 311 may be synchronized with a falling edge of the latch signal MLAT to generate the setting signal SET that is enabled to have a logic "high" level.

The buffer circuit 312 may remove a glitch that is included in the setting signal SET and may buffer the setting signal SET without the glitch to generate the detection signal DET having a logic "high" level.

At a time "T15", the pulse generation circuit 313 may generate the internal pulse signal IP having a logic "high" level.

The signal synthesis circuit 320 may generate the code strobe signal CODE_STR of a logic "high" level by performing a logical AND operation for the detection signal DET which has a logic "high" level and the internal pulse signal IP which has a logic "high" level.

The second input circuit 333 may inversely buffer the first to $K^{th}$ transmission signals TS<1:K> generated by the code strobe signal CODE_STR of a logic "high" level to generate the first to $K^{th}$ temperature latch signals TP_LAT<1:K> of the second logic level combination.

The controller 110 may adjust the refresh operation cycle based on the first to $K^{th}$ temperature information signals TP_INF<1:K> of the first logic level combination which are updated at the time "T11".

The electronic device 100 may update the first to $K^{th}$ temperature codes TCODE<1:K> of the first logic level combination based on the latch signal MLAT generated from the command signal CMD during the temperature information update operation. The electronic device 100 may adjust the refresh operation cycle based on the first to $K^{th}$ temperature information signals TP_INF<1:K> of the first logic level combination generated from the updated first to $K^{th}$ temperature codes TCODE<1:K>.

The temperature information update operation and the refresh operation of the electronic device 100 will be described hereinafter with reference to FIG. 11, in conjunction with a case that the latch signal MLAT may be generated from the command signal CMD during a generation period of a pulse included in the temperature output control signal TCO generated internally.

Figure 11:
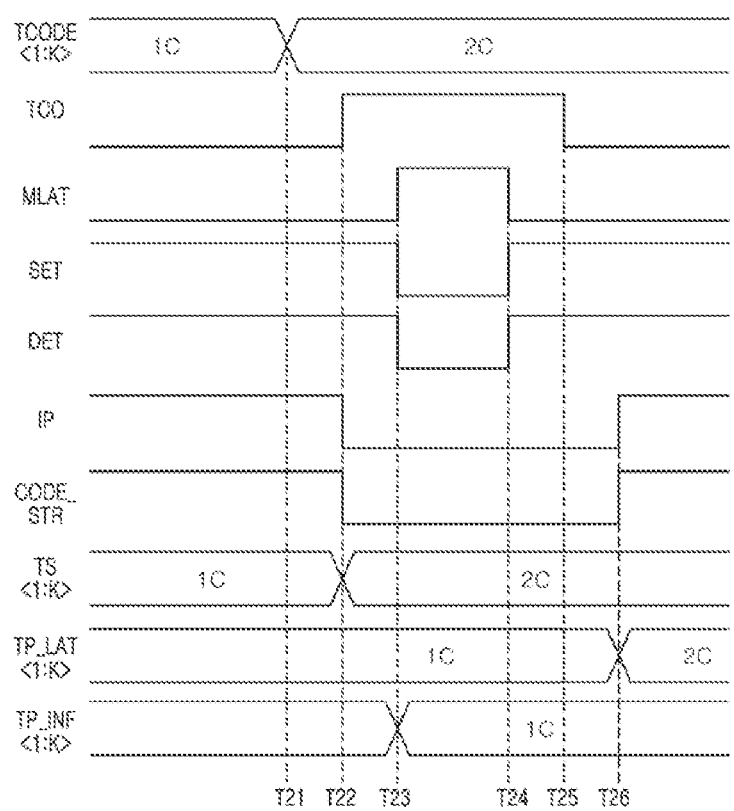

First, it may be assumed that "1C" illustrated in FIG. 11 may be set as a first logic level combination, "2C" illustrated in FIG. 11 may be set as a second logic level combination, and the first logic level combination may be different from the second logic level combination.

At a time "T21", the temperature code generation circuit 240 may generate the first to $K^{th}$ temperature codes TCODE<1:K> of the second logic level combination according to an internal temperature of the semiconductor device 120.

At a time "T22", the output control circuit 220 may be synchronized with the internal clock signal ICLK to generate the temperature output control signal TCO that is enabled to have a logic "high" level. A pulse width of the temperature output control signal TCO may be set as a period from the time "T22" to a time "T25".

The pulse generation circuit 313 may generate the internal pulse signal IP which has a logic "low" level based on the inverted temperature output control signal TCOB which has a logic "low" level obtained by inverting the temperature output control signal TCO.

The signal synthesis circuit 320 may generate the code strobe signal CODE_STR which has a logic "low" level by performing a logical AND operation for the detection signal DET which has a logic "high" level and the internal pulse signal IP which has a logic "low" level.

The first input circuit 332 may update the first to $K^{th}$ temperature codes TCODE<1:K> of the second logic level combination based on the code strobe signal CODE_STR which has a logic "low" level to generate the first to $K^{th}$ transmission signals TS<1:K>.

At a time "T23", the latch signal generation circuit 210 may generate the latch signal MLAT that is enabled to have a logic "high" level by the first to $J^{th}$ command signals CMD<1:J> of a first setting combination inputted in synchronization with the clock signal CLK. A pulse width of the latch signal MLAT may be set as a period from the time "T23" to a time "T24".

The setting signal generation circuit 311 may generate the setting signal SET of a logic "low" level in synchronization with a rising edge of the latch signal MLAT.

The buffer circuit 312 may remove a glitch included in the setting signal SET and may buffer the setting signal SET without the glitch to generate the detection signal DET of a logic "low" level.

The temperature information signal generation circuit 340 may generate the first to $K^{th}$ temperature information signals TP_INF<1:K> of the first logic level combination based on the first to $K^{th}$ temperature latch signals TP_LAT<1:K> generated by the latch signal MLAT which has a logic "high" level. The first to $K^{th}$ temperature information signals TP_INF<1:K> may be outputted to the controller 110.

At the time T24, the setting signal generation circuit 311 may be synchronized with a falling edge of the latch signal MLAT to generate the setting signal SET that is enabled to a logic "high" level.

The buffer circuit 312 may remove a glitch included in the setting signal SET and may buffer the setting signal SET without the glitch to generate the detection signal DET which has a logic "high" level.

At a time "T26", the pulse generation circuit 313 may generate the internal pulse signal IP which has a logic "high" level.

The signal synthesis circuit 320 may generate the code strobe signal CODE_STR which has a logic "high" level by performing a logical AND operation for the detection signal DET which has a logic "high" level and the internal pulse signal IP which has a logic "high" level.

The second input circuit 333 may inversely buffer the first to $K^{th}$ transmission signals TS<1:K> generated by the code strobe signal CODE_STR which has a logic "high" level to generate the first to $K^{th}$ temperature latch signals TP_LAT<1:K> of the second logic level combination.

The controller 110 may adjust the refresh operation cycle based on the first to $K^{th}$ temperature information signals TP_INF<1:K> of the first logic level combination updated at the time "T23".

The electronic device 100 may update the first to $K^{th}$ temperature codes TCODE<1:K> of the first logic level combination based on the latch signal MLAT generated from the command signal CMD during the temperature information update operation. The electronic device 100 may adjust the refresh operation cycle based on the first to $K^{th}$ temperature information signals TP_INF<1:K> of the first logic level combination generated from the updated first to $K^{th}$ temperature codes TCODE<1:K>.

The temperature information update operation and the refresh operation of the electronic device 100 will be described hereinafter with reference to FIG. 12, in conjunction with a case that the latch signal MLAT may be generated from the command signal CMD after the temperature output control signal TCO is generated internally and pulses of the temperature output control signal TCO and the latch signal MLAT at least partially overlap with each other.

Figure 12:
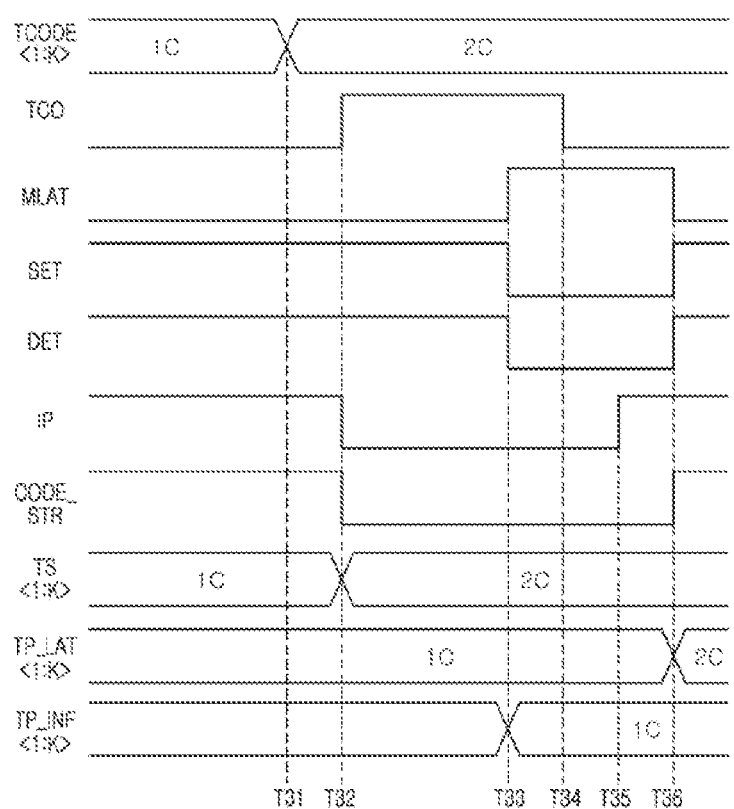

First, "1C" illustrated in FIG. 11 may be set as a first logic level combination, "2C" illustrated in FIG. 12 may be set as a second logic level combination, and the first logic level combination may be different from the second logic level combination.

At a time "T31", the temperature code generation circuit 240 may generate the first to $K^{th}$ temperature codes TCODE<1:K> of the second logic level combination according to an internal temperature of the semiconductor device 120.

At a time "T32", the output control circuit 220 may be synchronized with the internal clock signal ICLK to generate the temperature output control signal TCO that is enabled to a logic "high" level. A pulse width of the temperature output control signal TCO may be set as a period from the time "T32" to a time "T34".

The pulse generation circuit 313 may generate the internal pulse signal IP of a logic "low" level based on the inverted temperature output control signal TCOB of a logic "low" level obtained by inverting the temperature output control signal TCO.

The signal synthesis circuit 320 may generate the code strobe signal CODE_STR of a logic "low" level by performing a logical AND operation for the detection signal DET of a logic "high" level and the internal pulse signal IP of a logic "low" level.

The first input circuit 332 may update the first to $K^{th}$ temperature codes TCODE<1:K> of the second logic level combination based on the code strobe signal CODE_STR which has a logic "low" level to generate the first to $K^{th}$ transmission signals TS<1:K>.

At a time "T33", the latch signal generation circuit 210 may generate the latch signal MLAT that is enabled to have a logic "high" level by the first to $J^{th}$ command signals CMD<1:J> of a first setting combination inputted in synchronization with the clock signal CLK. A pulse width of the latch signal MLAT may be set as a period from the time "T33" to a time "T36".

The setting signal generation circuit 311 may be synchronized with a rising edge of the latch signal MLAT to generate the setting signal SET which has a logic "low" level.

The buffer circuit 312 may remove a glitch that is included in the setting signal SET and may buffer the setting signal SET without the glitch to generate the detection signal DET which has a logic "low" level.

The temperature information signal generation circuit 340 may generate the first to $K^{th}$ temperature information signals TP_INF<1:K> of the first logic level combination based on the first to $K^{th}$ temperature latch signals TP_LAT<1:K> generated by the latch signal MLAT of a logic "high" level. Here, it can be seen that the temperature information signal generation circuit 340 generates the first to $K^{th}$ temperature information signals TP_INF<1:K> of the first logic level combination, which is not the second logic level combination, based on the latch signal MLAT which has a logic "high" level. That is, the temperature information signal generation circuit 340 may generate the first to $K^{th}$ temperature information signals TP_INF<1:K> of the first logic level combination because the update of the first to $K^{th}$ temperature codes TCODE<1:K> of the second logic level combination may be interrupted. The first to $K^{th}$ temperature information signals TP_INF<1:K> may be outputted to the controller 110.

At a time "T35", the pulse generation circuit 313 may generate the internal pulse signal IP which has a logic "high" level.

At the time "T36", the setting signal generation circuit 311 may be synchronized with a falling edge of the latch signal MLAT to generate the setting signal SET that is enabled to a logic "high" level.

The buffer circuit 312 may remove a glitch included in the setting signal SET and may buffer the setting signal SET without the glitch to generate the detection signal DET which has a logic "high" level.

The signal synthesis circuit 320 may generate the code strobe signal CODE_STR of a logic "high" level by performing a logical AND operation for the detection signal DET which has a logic "high" level and the internal pulse signal IP which has a logic "high" level.

The second input circuit 333 may inversely buffer the first to $K^{th}$ transmission signals TS<1:K> based on the code strobe signal CODE_STR which has a logic "high" level to generate the first to $K^{th}$ temperature latch signals TP_LAT<1:K> of the second logic level combination.

The controller 110 may adjust the refresh operation cycle based on the first to $K^{th}$ temperature information signals TP_INF<1:K> of the first logic level combination updated at the time "T33".

The electronic device 100 may update the first to $K^{th}$ temperature codes TCODE<1:K> of the first logic level combination based on the latch signal MLAT generated from the command signal CMD during the temperature information update operation. The electronic device 100 may adjust the refresh operation cycle based on the first to $K^{th}$ temperature information signals TP_INF<1:K> of the first logic level combination generated from the updated first to $K^{th}$ temperature codes TCODE<1:K>.

The temperature information update operation and the refresh operation of the electronic device 100 according an embodiment of the present disclosure will be described hereinafter with reference to FIG. 13, in conjunction with a case that the latch signal MLAT may be generated from the command signal CMD after the temperature output control signal TCO is generated internally and pulses of the temperature output control signal TCO and the latch signal MLAT do not overlap with each other.

Figure 13:
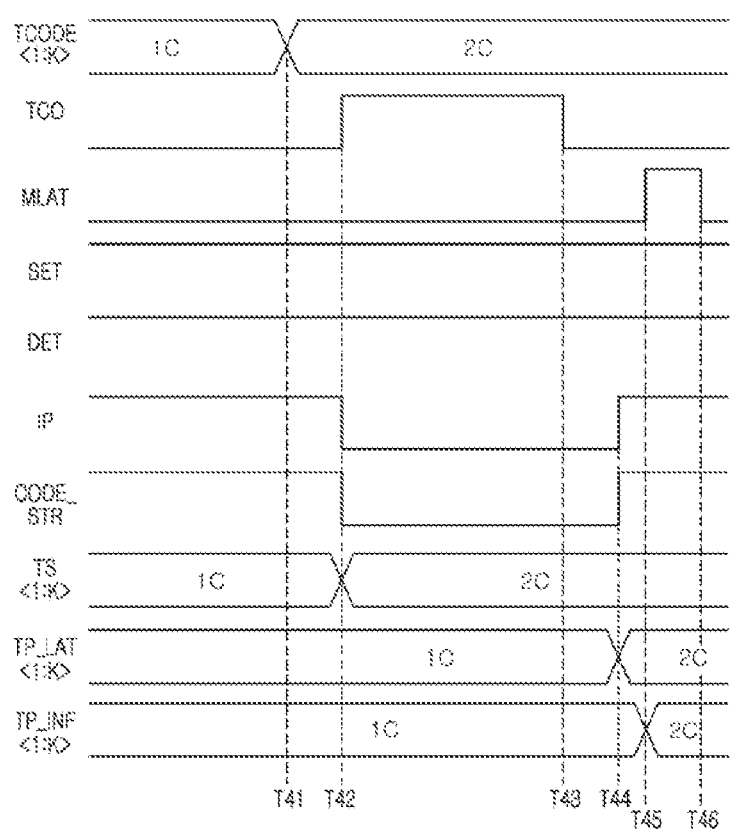

First, it may be assumed that "1C" illustrated in FIG. 13 may be set as a first logic level combination, "2C" illustrated in FIG. 13 may be set as a second logic level combination, and the first logic level combination may be different from the second logic level combination.

At a time "T41", the temperature code generation circuit 240 may generate the first to $K^{th}$ temperature codes TCODE<1:K> of the second logic level combination according to an internal temperature of the semiconductor device 120.

At a time "T42", the output control circuit 220 may be synchronization with the internal clock signal ICLK to generate the temperature output control signal TCO that is enabled to a logic "high" level. A pulse width of the temperature output control signal TCO may be set as a period from the time "T42" to a time "T43".

The pulse generation circuit 313 may generate the internal pulse signal IP which has a logic "low" level based on the inverted temperature output control signal TCOB which has a logic "low" level obtained by inverting the temperature output control signal TCO.

The signal synthesis circuit 320 may generate the code strobe signal CODE_STR which has a logic "low" level by performing a logical AND operation for the detection signal DET which has a logic "high" level and the internal pulse signal IP which has a logic "low" level.

The first input circuit 332 may update the first to $K^{th}$ temperature codes TCODE<1:K> of the second logic level combination based on the code strobe signal CODE_STR which has a logic "low" level to generate the first to $K^{th}$ transmission signals TS<1:K>.

At a time "T44", the pulse generation circuit 313 may generate the internal pulse signal IP which has a logic "high" level.

The signal synthesis circuit 320 may generate the code strobe signal CODE_STR which has a logic "high" level by performing a logical AND operation for the detection signal DET which has a logic "high" level and the internal pulse signal IP which has a logic "high" level.

The second input circuit 333 may inversely buffer the first to $K^{th}$ transmission signals TS<1:K> based on the code strobe signal CODE_STR which has a logic "high" level to generate the first to K temperature latch signals TP_LAT<1:K> of the second logic level combination.

At a time "T45", the latch signal generation circuit 210 may generate the latch signal MLAT that is enabled to have a logic "high" level by the first to $J^{th}$ command signals CMD<1:J> of a first setting combination inputted in synchronization with the clock signal CLK. A pulse width of the latch signal MLAT may be set as a period from the time "T45" to a time "T46".

The temperature information signal generation circuit 340 may generate the first to $K^{th}$ temperature information signals TP_INF<1:K> of the second logic level combination based on the first to $K^{th}$ temperature latch signals TP_LAT<1:K> generated by the latch signal MLAT which has a logic "high" level. The first to $K^{th}$ temperature information signals TP_INF<1:K> may be outputted to the controller 110.

The controller 110 may adjust the refresh operation cycle based on the first to $K^{th}$ temperature information signals TP_INF<1:K> of the first logic level combination updated at the time "T45".

The electronic device 100 may update the first to $K^{th}$ temperature codes TCODE<1:K> of the first logic level combination based on the latch signal MLAT generated from the command signal CMD during the temperature information update operation. The electronic device 100 may adjust the refresh operation cycle based on the first to $K^{th}$ temperature information signals TP_INF<1:K> of the first logic level combination generated from the updated first to $K^{th}$ temperature codes TCODE<1:K>.

As described above, an electronic device according to an embodiment of the present disclosure may update temperature information according to a comparison result of input times of a signal generated from a command signal and a signal generated internally, thereby improving the reliability of the temperature information. In addition, the electronic device may update the temperature information according to the comparison result of the input times of the signal generated from the command signal and the signal generated internally, thereby adjusting a cycle of a refresh operation. As a result, it may be possible to efficiently perform the refresh operation.

Figure 14:
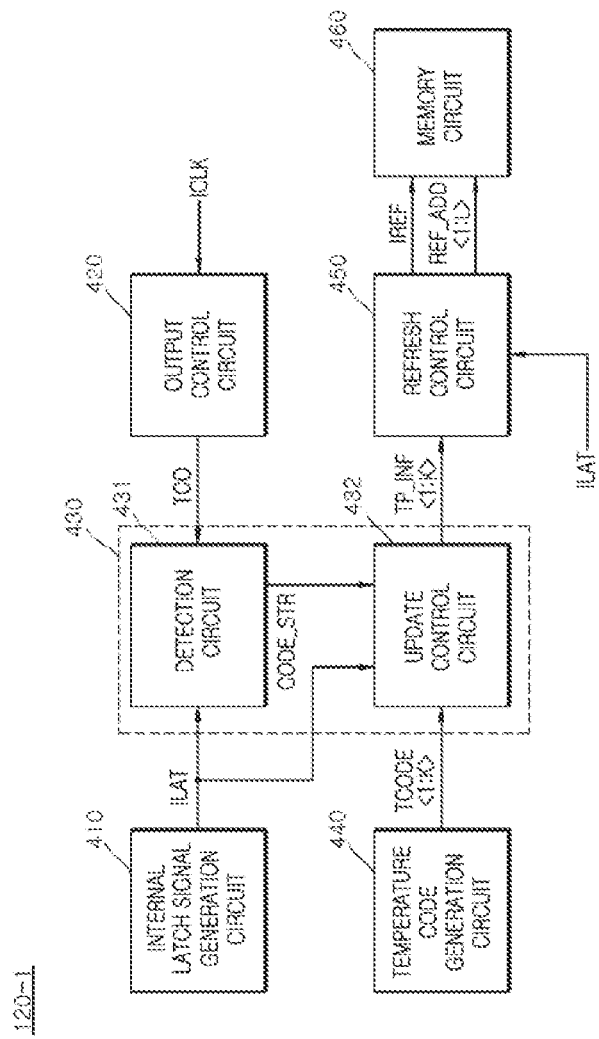
FIG. 14 is a block diagram illustrating a configuration of a semiconductor device according to another embodiment of the present disclosure.

FIG. 14 is a block diagram illustrating a configuration of a semiconductor device 120-1 according to another embodiment. As illustrated in FIG. 14, the semiconductor device 120-1 may include an internal latch signal generation circuit 410, an output control circuit 420, a temperature control circuit 430, a temperature code generation circuit 440, a refresh control circuit 450, and a memory circuit 460.

The internal latch signal generation circuit 410 may generate an internal latch signal ILAT that is enabled during a self-refresh operation. The internal latch signal generation circuit 410 may generate the internal latch signal ILAT that is periodically enabled during the self-refresh operation. A cycle of the internal latch signal ILAT may be set to be different according to the embodiments. The internal latch signal ILAT may be set as a signal that is enabled during the self-refresh operation.

The output control circuit 420 may be synchronized with an internal clock signal ICLK to generate a temperature output control signal TCO that is periodically enabled. The output control circuit 420 may count pulses of the internal clock signal ICLK to generate the temperature output control signal TCO. The output control circuit 420 may generate the temperature output control signal TCO including pulses, each of which is generated when a pulse of the internal clock signal ICLK is inputted by a set number of times. The internal clock signal ICLK may be generated in the semiconductor device 120-1 based on a clock signal CLK outputted from the controller 110. The set number of times means a predetermined number of times by which a pulse included in the internal clock signal ICLK is inputted to the output control circuit 420, and the set number of times may be set to be different according to the embodiments. The temperature output control signal TCO may be set as a signal that is enabled to update first to $K^{th}$ temperature codes TCODE<1:K> at a time when the first to $K^{th}$ temperature codes TCODE<1:K> change.

The temperature control circuit 430 may include a detection circuit 431 and an update control circuit 432.

The detection circuit 431 may compare an input time of the temperature output control signal TCO with an input time of the internal latch signal ILAT. The detection circuit 431 may generate a code strobe signal CODE_STR whose pulse width is adjusted according to a comparison result of the input times of the temperature output control signal TCO and the internal latch signal ILAT. The detection circuit 431 may compare an input time of the temperature output control signal TCO with an input time of the internal latch signal ILAT.

The update control circuit 432 may update the first to $K^{th}$ temperature codes TCODE<1:K> based on the internal latch signal ILAT and the code strobe signal CODE_STR. The update control circuit 432 may interrupt the update of the first to $K^{th}$ temperature codes TCODE<1:K> based on the internal latch signal ILAT and the code strobe signal CODE_STR. The update control circuit 432 may generate first to $K^{th}$ temperature information signals TP_INF<1:K> based on the first to $K^{th}$ temperature codes TCODE<1:K> which are updated by the internal latch signal ILAT and the code strobe signal CODE_STR.

The temperature control circuit 430 may compare an input time of the temperature output control signal TCO with an input time of the internal latch signal ILAT. The temperature control circuit 430 may update the first to $K^{th}$ temperature codes TCODE<1:K> according to a comparison result of the input times of the temperature output control signal TCO and the internal latch signal ILAT. The temperature control circuit 430 may interrupt the update of the first to $K^{th}$ temperature codes TCODE<1:K> according to the comparison result of the input times of the temperature output control signal TCO and the internal latch signal ILAT. The temperature control circuit 430 may generate the first to $K^{th}$ temperature information signals TP_INF<1:K> based on the updated first to $K^{th}$ temperature codes TCODE<1:K>. The temperature control circuit 430 illustrated in FIG. 14 may be realized to have the same configuration as the temperature control circuit 230 illustrated in FIG. 2 except that the temperature control circuit 430 receives the internal latch signal ILAT instead of the latch signal MLAT illustrated in FIG. 2. Thus, detailed descriptions of the temperature control circuit 430 will be omitted hereinafter.

The temperature code generation circuit 440 may generate the first to $K^{th}$ temperature codes TCODE<1:K> according to an internal temperature of the semiconductor device 120-1. The temperature code generation circuit 440 may periodically generate the first to $K^{th}$ temperature codes TCODE<1:K> including temperature information of the semiconductor device 120-1. The first to $K^{th}$ temperature codes TCODE<1:K> may be periodically generated regardless of external control. A cycle of the first to $K^{th}$ temperature codes TCODE<1:K> may be set to be different according to the embodiments.

Meanwhile, a logic level combination of the first to $K^{th}$ temperature codes TCODE<1:K> generated by the temperature code generation circuit 440 may be changed or may not be changed according to the internal temperature of the semiconductor device 120-1 at a time when the temperature output control signal TCO is generated.

The refresh control circuit 450 may generate an internal refresh signal IREF and first to $L^{th}$ refresh addresses REF_ADD<1:L> based on the internal latch signal ILAT and the first to $K^{th}$ temperature information signals TP_INF<1:K>. When the internal latch signal ILAT is inputted to the refresh control circuit 450, the refresh control circuit 450 may generate the internal refresh signal IREF and the first to $L^{th}$ refresh address REF_ADD<1:L> whose generation cycles are adjusted based on the first to $K^{th}$ temperature information signals TP_INF<1:K>. When the internal latch signal ILAT is inputted to the refresh control circuit 450 and the first to $K^{th}$ temperature information signals TP_INF<1:K> include high-temperature information, the refresh control circuit 450 may generate the internal refresh signal IREF including pulses generated to have a first cycle. When the internal latch signal ILAT is inputted to the refresh control circuit 450 and the first to $K^{th}$ temperature information signals TP_INF<1:K> include the high-temperature information, the refresh control circuit 450 may generate the first to $L^{th}$ refresh addresses REF_ADD<1:L> having the first cycle. When the internal latch signal ILAT is inputted to the refresh control circuit 450 and the first to $K^{th}$ temperature information signals TP_INF<1:K> include low-temperature information, the refresh control circuit 450 may generate the first to L refresh addresses REF_ADD<1:L> having a second cycle. The first cycle may be set to be shorter than the second cycle. A difference between the first cycle and the second cycle may be set to be different according to the embodiments.

The memory circuit 460 may perform a refresh operation based on the internal refresh signal IREF and the first to $L^{th}$ refresh addresses REF_ADD<1:L>. The memory circuit 460 may perform a refresh operation for memory cells (not illustrated) selected by the first to $L^{th}$ refresh addresses REF_ADD<1:L> whenever a pulse of the internal refresh signal IREF is inputted. The refresh operation may include an auto-refresh operation and a self-refresh operation. Although the memory circuit 460 may be illustrated to have a configuration for performing the refresh operation, the memory circuit 460 may also be configured to additionally perform a read operation and a write operation for the output and input of data.

Figure 15:
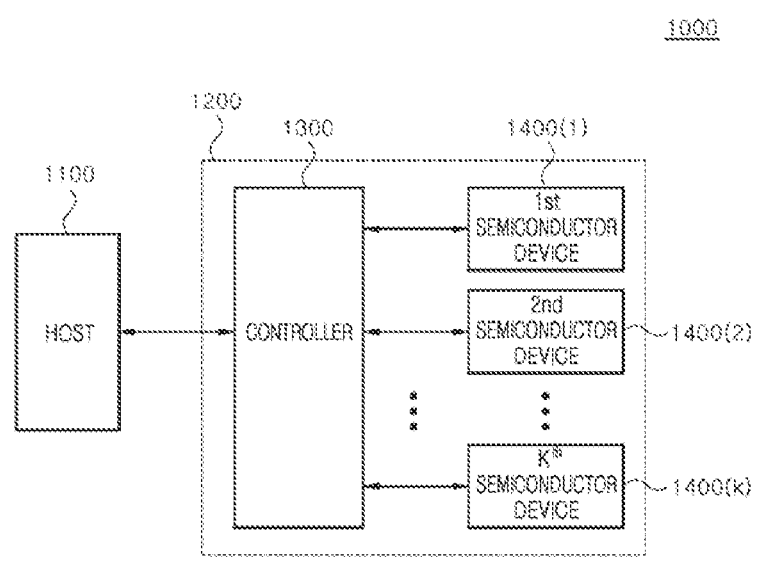
FIG. 15 is a block diagram illustrating a configuration of an electronic system including at least one of the semiconductor device illustrated in FIGS. 1 to 8 and the semiconductor device illustrated in FIG. 14.

FIG. 15 is a block diagram illustrating a configuration of an electronic system 1000 according to an embodiment of the present disclosure. As illustrated in FIG. 15, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of a multi-media card (MMC), an enhanced small disk interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), a Universal Serial Bus (USB), and so on.

The semiconductor system 1200 may include a controller 1300 and semiconductor devices 1400(K:1). The controller 1300 may control the semiconductor devices 1400(K:1) such that the semiconductor devices 1400(K:1) perform a temperature information update operation. Each of the semiconductor devices 1400(K:1) may update temperature information according to a comparison result of an input time of a signal generated from a command signal and an input time of a signal generated internally, thereby improving the reliability of the temperature information. In addition, each of the semiconductor devices 1400(K:1) may adjust a refresh operation cycle by updating the temperature information according to the comparison result of the input time of the signal generated from the command signal and the input time of the signal generated internally, thereby controlling the refresh operation cycle. Thus, it may be possible to efficiently perform the refresh operation.

The controller 1300 may be realized using the controller 110 illustrated in FIG. 1. Each of the semiconductor devices 1400(K:1) may be realized using at least one of the semiconductor device 120 illustrated in FIG. 1 and the semiconductor device 120-1 illustrated in FIG. 14. In some embodiments, the semiconductor device 120 or the semiconductor device 120-1 may be realize using one of a dynamic random access memory (DRAM), a phase change random access memory (PRAM), a resistive random access memory (RRAM), a magnetic random access memory (MRAM), and a ferroelectric random access memory (FRAM).

What is claimed is:

1. An electronic device comprising:
   a controller configured to output a clock signal and a command signal having a first setting combination or a second setting combination and configured to receive a temperature information signal; and
   a semiconductor device configured to compare an input time of a latch signal generated based on the command signal having the first setting combination with an input time of a temperature output control signal generated internally and configured to update a temperature code according to a comparison result of the input times of the temperature output control signal and the latch signal to generate the temperature information signal.

2. The electronic device of claim 1, wherein the controller adjusts a refresh operation cycle of the semiconductor device based on the temperature information signal.

3. The electronic device of claim 1,
   wherein the temperature code includes information on an internal temperature of the semiconductor device; and
   wherein a logic level combination of the temperature code periodically varies according to the internal temperature.

4. The electronic device of claim 1, wherein the semiconductor device includes:
   a latch signal generation circuit configured to be synchronized with the clock signal to generate the latch signal based on the command signal having the first setting combination;
   an output control circuit configured to be synchronized with an internal clock signal to generate the temperature output control signal periodically enabled; and
   a temperature control circuit configured to compare the input time of the latch signal with the input time of the temperature output control signal and configured to update the temperature code according to a comparison result of the input times of the temperature output control signal and the latch signal to generate the temperature information signal.

5. The electronic device of claim 4, wherein the temperature control circuit includes:
   a detection circuit configured to compare the input time of the temperature output control signal with the input time of the latch signal and configured to generate a code strobe signal whose pulse width is adjusted according to the comparison result of the input times of the temperature output control signal and the latch signal; and
   an update control circuit configured to generate the temperature information signal by updating the temperature code or interrupting the update of the temperature code based on the latch signal and the code strobe signal.

6. The electronic device of claim 5, wherein the detection circuit includes:
   a comparison circuit configured to generate a detection signal by comparing the input time of the temperature output control signal with the input time of the latch signal and configured to generate an internal pulse signal that is enabled in synchronization with a falling edge of the temperature output control signal; and
   a signal synthesis circuit configured to generate the code strobe signal by synthesizing the detection signal and the internal pulse signal.

7. The electronic device of claim 6, wherein the comparison circuit includes:
   a setting signal generation circuit configured to generate a setting signal that is enabled in synchronization with a falling edge of the latch signal and disabled in synchronization with a rising edge of the temperature output control signal;
   a buffer circuit configured to generate the detection signal by removing a glitch included in the setting signal and buffering the setting signal without the glitch; and
   a pulse generation circuit configured to generate the internal pulse signal including a pulse generated by an inverted temperature output control signal obtained by inverting the temperature output control signal.

8. The electronic device of claim 5, wherein the update control circuit includes:
   a temperature latch signal generation circuit configured to generate a temperature latch signal by updating the temperature code or by interrupting the update of the temperature code based on the code strobe signal; and
   a temperature information signal generation circuit configured to generate the temperature information signal based on the latch signal and the temperature latch signal.

9. The electronic device of claim 8, wherein the temperature latch signal generation circuit includes:
   an inverted code strobe signal generation circuit configured to generate an inverted code strobe signal obtained by inverting the code strobe signal;
   a first input circuit configured to generate a transmission signal by updating the temperature code based on the code strobe signal and the inverted code strobe signal; and
   a second input circuit configured to generate the temperature latch signal based on the code strobe signal, the inverted code strobe signal, and the transmission signal.

10. The electronic device of claim 8, wherein the temperature information signal generation circuit includes:
    an inverted latch signal generation circuit configured to generate an inverted latch signal by inversely buffering the latch signal; and
    an output circuit configured to generate the temperature information signal based on the latch signal, the inverted latch signal, and the temperature latch signal.

11. The electronic device of claim 1, wherein the semiconductor device includes:
    a refresh signal generation circuit configured to be synchronized with the clock signal to generate a refresh signal based on the command signal having the second setting combination;
    a refresh control circuit configured to generate an internal refresh signal and a refresh address whose cycles are adjusted by the refresh signal; and
    a memory circuit configured to perform the refresh operation based on the internal refresh signal and the refresh address.

12. The electronic device of claim 11,
    wherein the internal refresh signal is generated to include pulses generated to have a first cycle when the temperature information signal includes high-temperature information;
    wherein the internal refresh signal is generated to include pulses generated to have a second cycle when the temperature information signal includes low-temperature information; and
    wherein the first cycle is shorter than the second cycle.

13. An electronic device comprising:
    a temperature control circuit configured to compare an input time of a temperature output control signal generated internally with an input time of a latch signal generated from a command signal provided by an external device and configured to update a temperature code according to a comparison result of the input times of the temperature output control signal and the latch signal to generate a temperature information signal; and
    a refresh control circuit configured to generate an internal refresh signal for performing a refresh operation based on a refresh signal generated by the temperature information signal.

14. The electronic device of claim 13,
    wherein the temperature code includes information on internal temperature of the electronic device; and
    wherein a logic level combination of the temperature code periodically varies according to the internal temperature.

15. The electronic device of claim 13,
    wherein the internal refresh signal is generated to include pulses generated to have a first cycle when the temperature information signal includes high-temperature information;
    wherein the internal refresh signal is generated to include pulses generated to have a second cycle when the temperature information signal includes low-temperature information; and
    wherein the first cycle is shorter than the second cycle.

16. The electronic device of claim 13, wherein the temperature control circuit includes:
    a detection circuit configured to compare the input time of the temperature output control signal with the input time of the latch signal and configured to generate a code strobe signal whose pulse width is adjusted according to the comparison result of the input times of the temperature output control signal and the latch signal; and an update control circuit configured to generate the temperature information signal by updating the temperature code or interrupting the update of the temperature code based on the latch signal and the code strobe signal.

17. The electronic device of claim 16, wherein the detection circuit includes:
  a comparison circuit configured to generate a detection signal by comparing the input time of the temperature output control signal with the input time of the latch signal and configured to generate an internal pulse signal that is enabled in synchronization with a falling edge of the temperature output control signal; and
  a signal synthesis circuit configured to generate the code strobe signal by synthesizing the detection signal and the internal pulse signal.

18. The electronic device of claim 17, wherein the comparison circuit includes:
  a setting signal generation circuit configured to generate a setting signal that is enabled in synchronization with a falling edge of the latch signal and disabled in synchronization with a rising edge of the temperature output control signal;
  a buffer circuit configured to generate the detection signal by removing a glitch included in the setting signal and buffering the setting signal without the glitch; and
  a pulse generation circuit configured to generate the internal pulse signal including a pulse generated by an inverted temperature output control signal obtained by inverting the temperature output control signal.

19. The electronic device of claim 16, wherein the update control circuit includes:
  a temperature latch signal generation circuit configured to generate a temperature latch signal by updating the temperature code or by interrupting the update of the temperature code based on the code strobe signal; and
  a temperature information signal generation circuit configured to generate the temperature information signal based on the latch signal and the temperature latch signal.

20. The electronic device of claim 19, wherein the temperature latch signal generation circuit includes:
  an inverted code strobe signal generation circuit configured to generate an inverted code strobe signal obtained by inverting the code strobe signal;
  a first input circuit configured to generate a transmission signal by updating the temperature code based on the code strobe signal and the inverted code strobe signal; and
  a second input circuit configured to generate the temperature latch signal based on the code strobe signal, the inverted code strobe signal, and the transmission signal.

21. The electronic device of claim 19, wherein the temperature information signal generation circuit includes:
  an inverted latch signal generation circuit configured to generate an inverted latch signal by inversely buffering the latch signal; and
  an output circuit configured to generate the temperature information signal based on the latch signal, the inverted latch signal, and the temperature latch signal.

22. An electronic device comprising:
  a temperature control circuit configured to compare an input time of a temperature output control signal generated internally with an input time of an internal latch signal and configured to update a temperature code according to a comparison result of the input times of the temperature output control signal and the internal latch signal to generate a temperature information signal; and
  a refresh control circuit configured to generate an internal refresh signal for performing a refresh operation based on the temperature information signal.

* * * * *